United States Patent
Kuang et al.

(10) Patent No.: US 7,352,586 B2
(45) Date of Patent: Apr. 1, 2008

(54) AUXILIARY SUPPORTING STRUCTURE OF CIRCUIT BOARD AND ASSEMBLING METHOD FOR THE SAME

(75) Inventors: Yen Kuang, Taipei (TW); Yang Tzung Lien, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 241 days.

(21) Appl. No.: 11/208,610

(22) Filed: Aug. 23, 2005

(65) Prior Publication Data

US 2006/0044764 A1 Mar. 2, 2006

(30) Foreign Application Priority Data

Aug. 26, 2004 (TW) .............................. 93125637 A

(51) Int. Cl.
H05K 7/20 (2006.01)
F28F 7/00 (2006.01)
H01L 23/34 (2006.01)

(52) U.S. Cl. .................... 361/719; 165/80.3; 165/185; 257/719; 361/704; 361/710

(58) Field of Classification Search ........ 257/718–719; 361/719–720
See application file for complete search history.

(56) References Cited

U.S. PATENT DOCUMENTS

| | | | | |
|---|---|---|---|---|
| 5,607,538 A | * | 3/1997 | Cooke | 156/291 |
| 5,999,402 A | * | 12/1999 | Jeffries et al. | 361/687 |
| 6,226,179 B1 | * | 5/2001 | Lee | 361/687 |
| 6,549,410 B1 | * | 4/2003 | Cohen | 361/704 |
| 6,639,804 B1 | * | 10/2003 | Chen | 361/719 |
| 6,717,815 B2 | * | 4/2004 | Yang | 361/719 |
| 7,042,727 B2 | * | 5/2006 | Ulen et al. | 361/704 |
| 7,120,027 B2 | * | 10/2006 | Yatskov et al. | 361/716 |
| 2005/0068741 A1 | * | 3/2005 | Bailey et al. | 361/719 |
| 2005/0214784 A1 | * | 9/2005 | Rabbani et al. | 435/6 |

* cited by examiner

Primary Examiner—Gregory D Thompson
(74) Attorney, Agent, or Firm—Birch, Stewart, Kolasch & Birch, LLP

(57) ABSTRACT

An auxiliary supporting structure of a circuit board is for supporting at least one part of the circuit board. The circuit board has a CPU socket for connected to a CPU, and a through hole through which a heat sink fixing element passes. The auxiliary supporting structure includes a buffer body and a supporting element. In this case, the buffer body is disposed on a housing and has a first surface facing the circuit board. The buffer body is positioned between the circuit board and the housing. The supporting element is disposed on the buffer body and faces the through hole. The heat sink fixing element passes through the through hole and is fixed to the supporting element. An assembling method for the auxiliary supporting structure of the circuit board is provided.

14 Claims, 9 Drawing Sheets

AUXILIARY SUPPORTING STRUCTURE OF CIRCUIT BOARD AND ASSEMBLING METHOD FOR THE SAME

BACKGROUND OF THE INVENTION

1. Field of Invention

The invention relates to a supporting structure and the assembling method thereof. In particular, the invention relates to an auxiliary supporting structure of a circuit board and an assembling method thereof.

2. Related Art

The central processing unit (CPU) mostly determines the performance of a computer. Therefore, it is a marketing trend to provide the high-frequency and high-speed CPU.

However, the high-frequency and high-speed CPU generates more heat that increases the internal temperature of the computer. The high temperature seriously threatens the stability of the CPU operation. For ensuring the normal operation of the CPU, heat has to be removed in time. A common method is to install a heat sink on the surface of the CPU for removing the heat it generates.

A conventional heat sink fixing element 10 provides a mechanism for tying a heat sink 11 and a CPU 12 tightly. As shown in FIG. 1, the heat sink fixing element 10 has a base 13. Each edge of the base 13 has at least one protruding screw boss 14, and a protruding pad 131 is set at the center of the base 13.

Moreover, the base 13 is provided with an insulating slice 15 to prevent the base 13 from directly contacting a circuit board 16 and resulting in a short circuit. The screw boss 14 passes through the heat sink 11, the insulating slice 15, the circuit board 16, and the base 13, and fixes with a screw 17 (as shown in FIG. 2). Thus, the heat sink 11 can be tightly pressed against the CPU 12 on the circuit board 16. The pad 131 at the center of the base 13 is pressed against the bottom of the CPU 12, ensuring that the CPU 12 contacts the heat sink 11 tightly to increase the heat dissipation efficiency of the CPU 12. Moreover, the circuit board 16 is installed on a computer housing 19 by using several second screws 18.

Since a metal heat sink 11 is generally heavy, it may impose a large strain on the CPU 12 attached to the heat sink 11. Resulting in the CPU 12 exerts pressure to deform the circuit board 16 and may even cause the internal circuit, the through hole on the circuit board 16, or the base to break.

It is therefore an important subjective of the invention to provide an auxiliary supporting structure of a circuit board and an assembling method for an auxiliary supporting structure, which can solve the above-mentioned problem of carrying the heat sink.

SUMMARY OF THE INVENTION

In view of the foregoing, the invention is to provide an auxiliary supporting structure of a circuit board to help supporting the weight of a heat sink and the assembling method thereof.

To achieve the above, an auxiliary supporting structure of a circuit board supports at least one part of the circuit board. The circuit board has a CPU socket for connecting to a CPU, and a through hole for receiving a heat sink fixing element. The auxiliary supporting structure includes a buffer body and a supporting element. In this case, the buffer body is disposed on a housing and has a first surface facing the circuit board. The buffer body is positioned between the circuit board and the housing. The supporting element is disposed on the buffer body and faces the through hole. The heat sink fixing element passes through the through hole and is fixed to the supporting element.

An assembling method for an auxiliary supporting structure of a circuit board is also disclosed, which includes the following steps: aligning a positioning tool on a housing; attaching a buffer body to the housing; removing the positioning tool from the housing; fixing a circuit board on the housing; installing a CPU on the circuit board; and inserting a heat sink fixing element through a heat sink and a circuit board to fix the heat sink fixing element on a supporting element so as to fix the heat sink on the CPU.

As mentioned above, the auxiliary supporting structure of the circuit board and the method for the same install a buffer body on a housing. Comparing to the prior art, a buffer body for a supporting element is installed on the housing in this invention to help supporting the circuit board and the weight of the heat sink in tight contact with the CPU on the circuit board. Since the buffer body is disposed on the housing that is firmer, the weight of the heat sink is distributed to the housing without deforming the circuit board or breaking the internal circuit, the through hole, or the buffer body. Therefore, the quality of the products is improved. Moreover, in an embodiment of the invention, the auxiliary supporting structure of the circuit board can further includes an adjusting element to connect the heat sink fixing element and the supporting element of different lengths, increasing the compatibility of the supporting structure of the circuit board of the invention with different types of heat sinks. In the assembling method of the invention, the positioning tool has several sets of through holes for different types of heat sinks to align with the positioning elements on the housing for a better compatibility. Furthermore, the auxiliary supporting structure of the circuit board can include a pad or an elastic slice on the buffer body to press against the circuit board. This ensures a tight attachment of the CPU on the heat sink to improve the heat dissipation efficiency.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

FIGS. 3 to 6 are for illustrating an auxiliary supporting structure of a circuit board according to a preferred embodiment of the invention.

Figure 1:
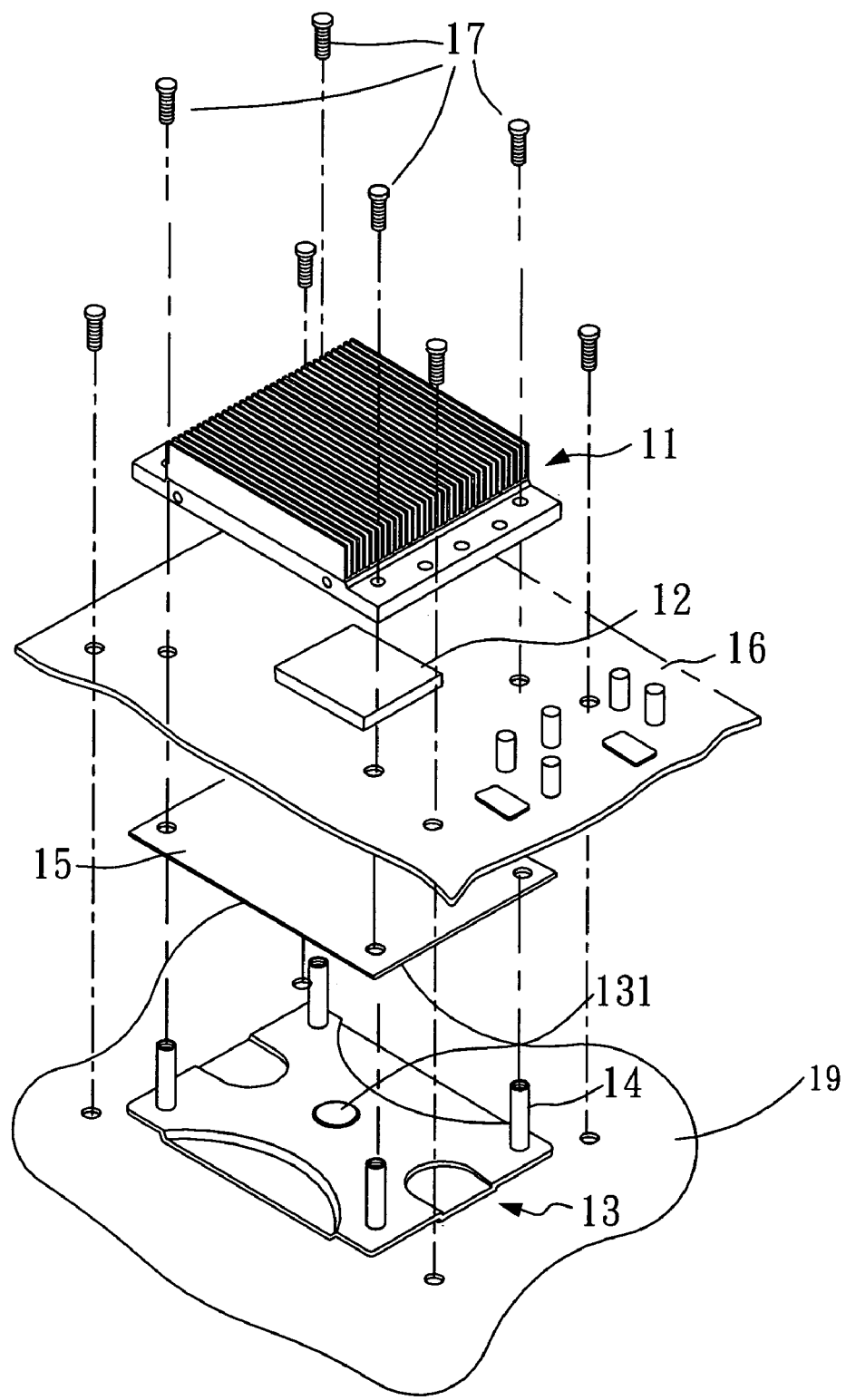
FIG. 1 is a schematic view showing the conventional heat sink fixing element.
Figure 2:
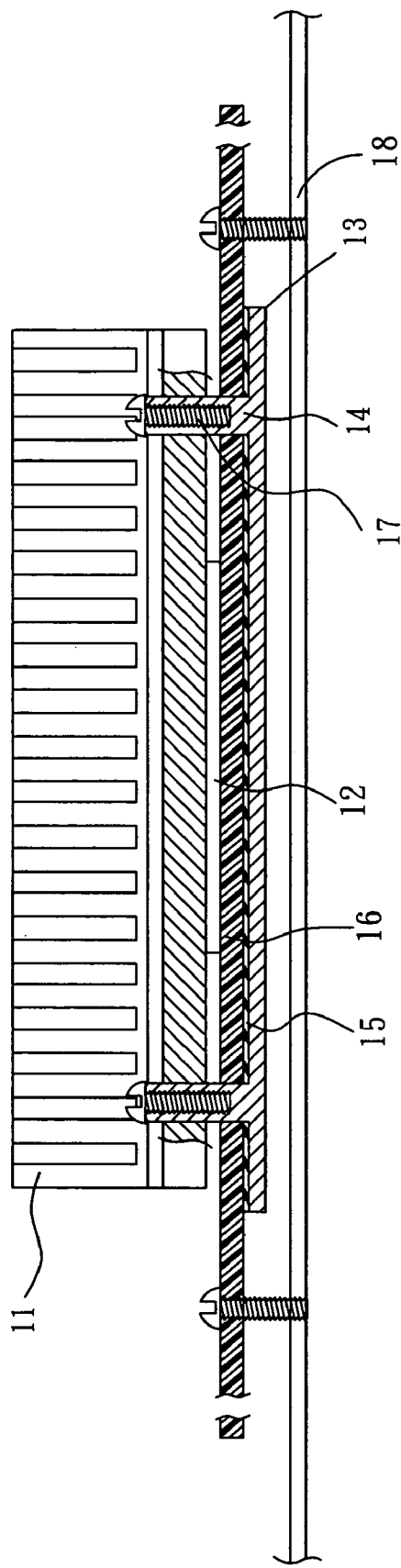
FIG. 2 is a schematic cross-sectional view of the conventional heat sink fixing element in connection.
Figure 3:
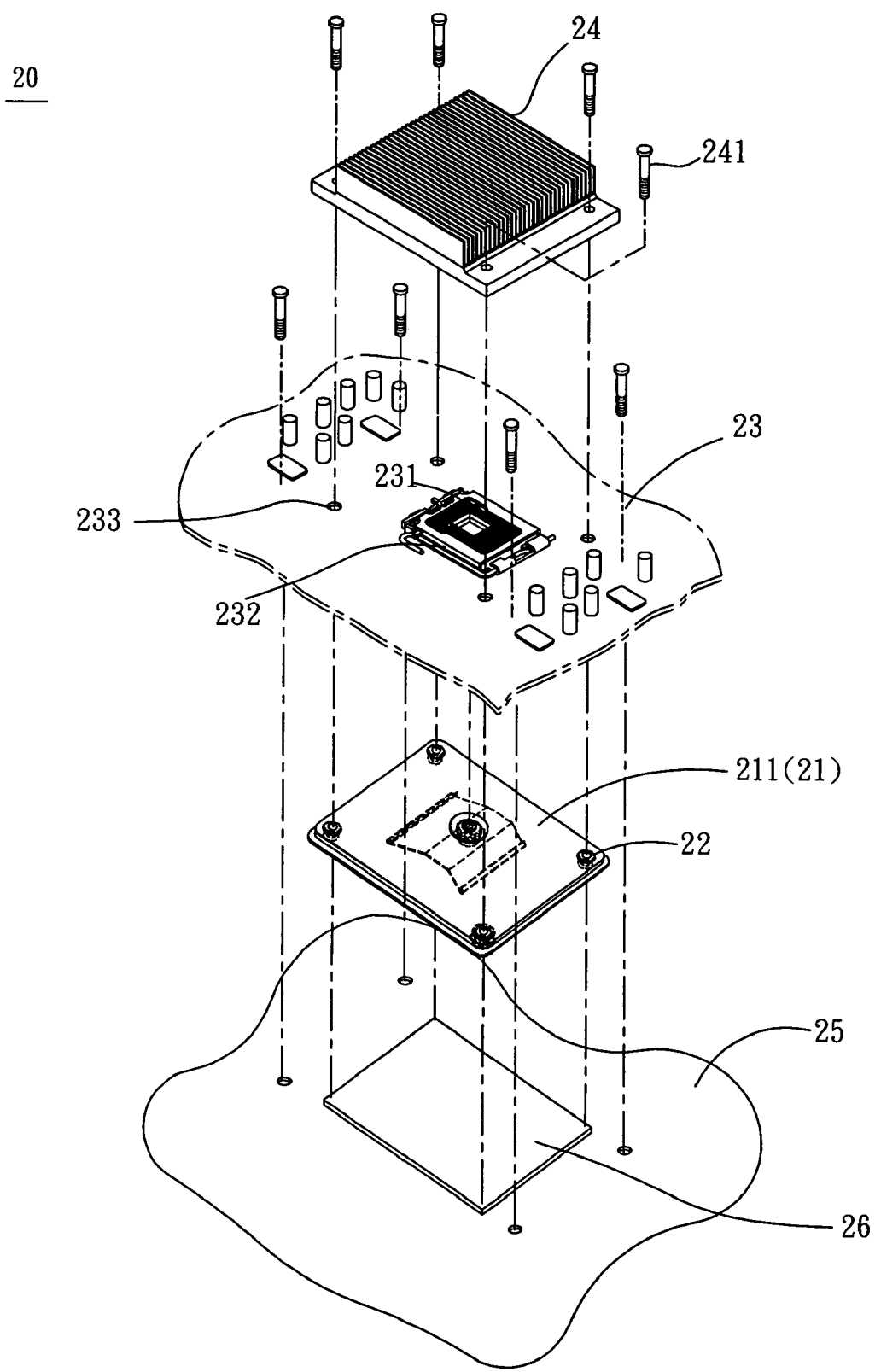
FIG. 3 is a schematic view of an auxiliary supporting structure of a circuit board according to a preferred embodiment of the invention.

With reference to FIG. 3, an auxiliary supporting structure 20 includes a buffer body 21 and a supporting element 22. The auxiliary supporting structure 20 is used to support at least one part of a circuit board 23. The circuit board 23 has a CPU socket for the connection of a CPU 231 and a through hole 233 through which a heat sink fixing element 241 passes.

In this embodiment, the heat sink fixing element 241 fixes a heat sink 24 on the CPU 231 to help removing heat from the CPU 231. Thus, the CPU 231 does not become unstable because of overheating.

Figure 4:
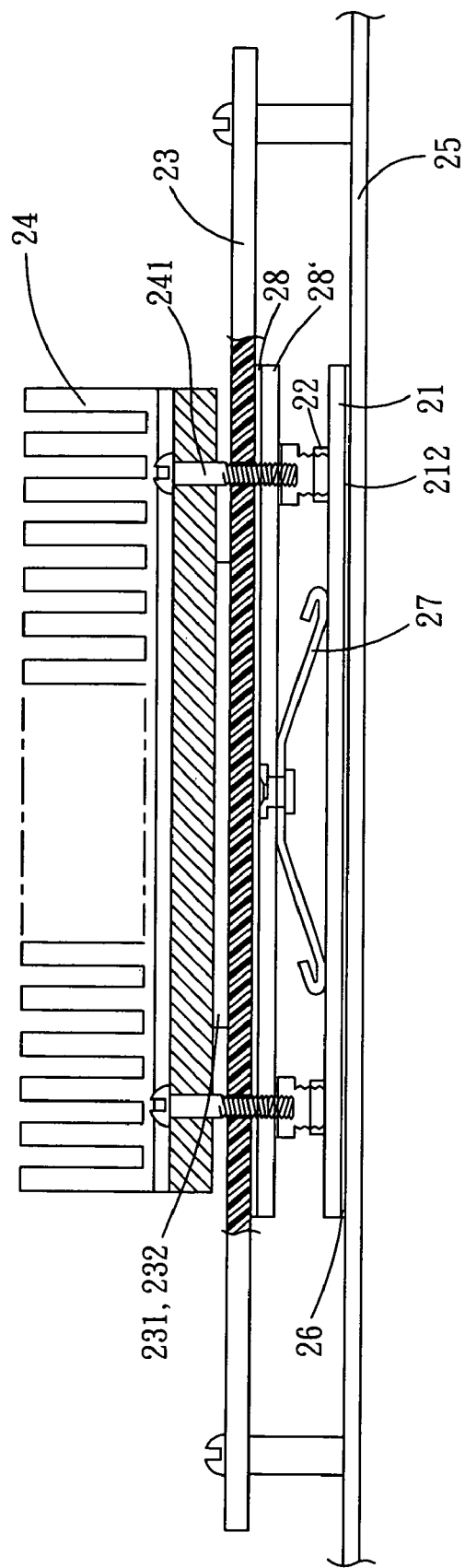
FIG. 4 is a schematic view showing the connection of the auxiliary supporting structure of the circuit board according to the preferred embodiment of the invention.

Referring to FIGS. 3 and 4, the buffer body 21 is installed on a housing 25. A first surface 211 of the buffer body 21 faces the circuit board 23. The buffer body 21 is positioned between the circuit board 23 and the housing 25.

In this embodiment, the auxiliary supporting structure 20 further includes an adhesive 26 on a second surface 212 of the buffer body 21. The adhesive 26 is for combining the buffer body 21 and the housing 25.

Figure 5:
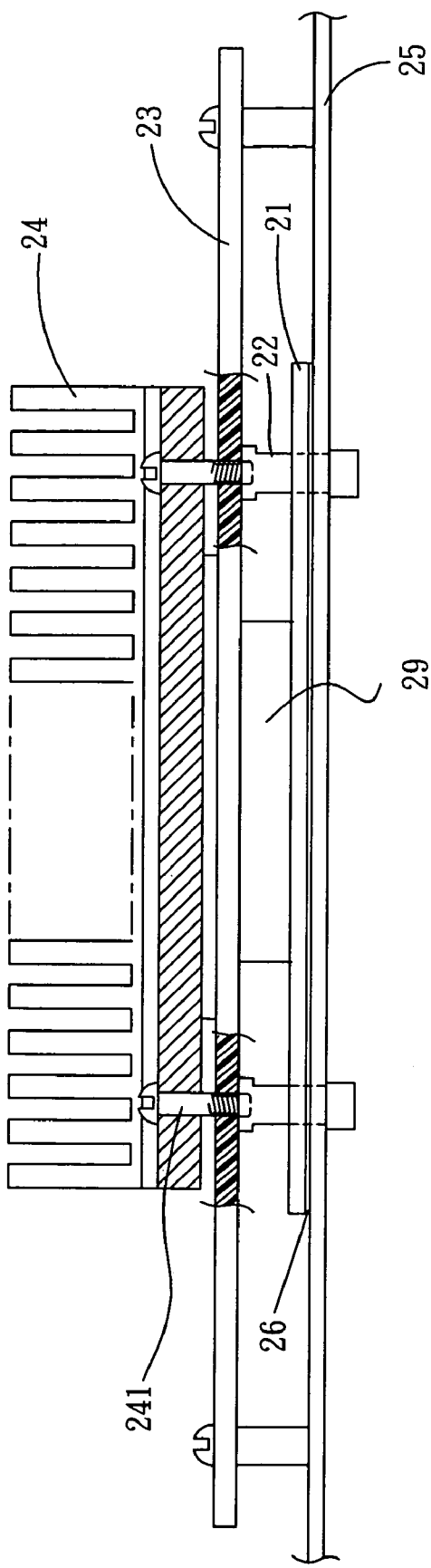
FIG. 5 is a schematic view showing the connection of another auxiliary supporting structure of the circuit board according to the preferred embodiment of the invention.

As shown in FIGS. 3 and 4, the supporting element 22 is installed on the buffer body 21 and faces the through hole 233. The heat sink fixing element 241 goes through the through hole 233 and is fixed to the supporting element 22. In this embodiment, the heat sink fixing element 241 is a screw and the supporting element 22 is a screw boss formed together with the buffer body 21. Moreover, as shown in FIG. 5, the supporting element 22 can be a combination of a bolt and a nut. The bolt goes through the housing 25 and combines with the nut.

Figure 6:
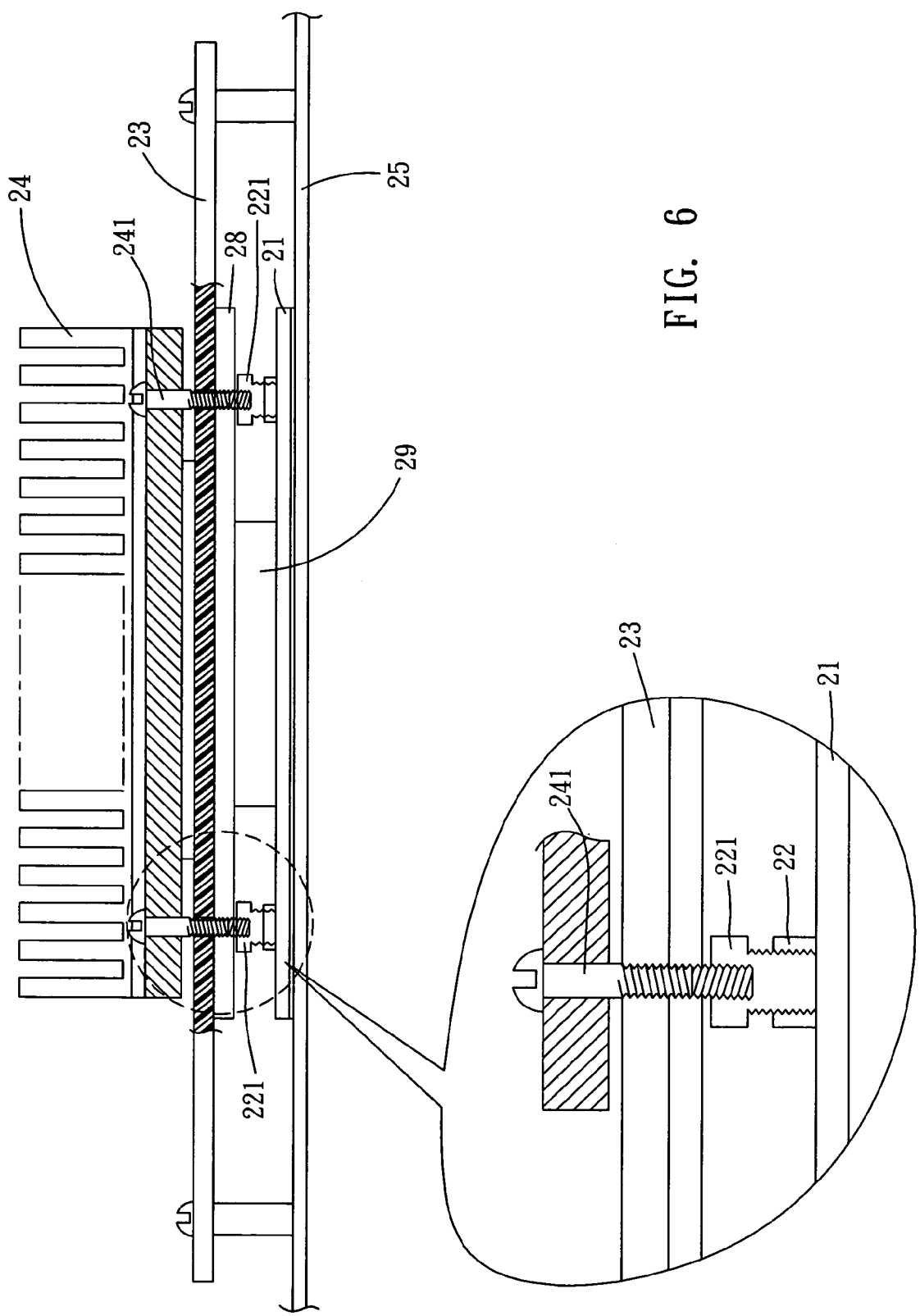
FIG. 6 is a schematic view showing the connection of still another auxiliary supporting structure of the circuit board according to the preferred embodiment of the invention.

With reference to FIG. 6, the auxiliary supporting structure 20 of the present embodiment also includes an adjusting element 221 disposed between the supporting element 22 and the heat sink fixing element 241 to fix the supporting element 22 and the heat sink fixing element 241. In this case, the adjusting element 221 is a screw with a screw hole. One end of the adjusting element 221 connects to the heat sink fixing element 241, while the other end thereof connects to the supporting element 22. Using the adjusting element 221, the heat sink fixing element 241 and the supporting element 22 are firmly connected. Hence, the heat sink fixing element 241 will not be unable to connect with the supporting element 22 because its length is too short. Thus, the adjusting element 221 increases the compatibility between the heat sink 24 and the buffer body 21.

Referring to FIG. 4 again, the auxiliary supporting structure 20 further includes an elastic slice 27 disposed between the buffer body 21 and the circuit board 23. The elastic slice 27 pushes upward against the circuit board 23 to ensure tight contact of the CPU 231 and the heat sink 24. Of course, the elastic slice 27 can be replaced by a spring. The material of the elastic slice 27 can be metal or plastic.

As shown in FIG. 4, the auxiliary supporting structure 20 further includes an insulating slice 28 disposed between the buffer body 21 and the circuit board 23, so that they are not in direct contact to form a short circuit. In this embodiment, the insulating slice 28 is installed on the elastic slice 27. If the insulating slice 28 is a soft thin sheet, a hard board 28' can be added to support the insulating. slice 28.

With reference to FIGS. 5 and 6, the auxiliary supporting structure 20 further includes a pad 29 disposed between the buffer body 21 and the circuit board 23. The pad 29 presses upward against the circuit board 23 to ensure tight contact of the CPU 231 and the heat sink 24. The pad 29 can further buffer the weight of the heat sink 24.

Using the buffer body 21 installed on the housing 25 and the supporting element 22 connected to the heat sink fixing element 241, the weight of the heat sink 24 can be distributed to the firmer housing 25, preventing the circuit board 23 and the through hole 233 from deforming or breaking.

FIGS. 3 to 9 show an assembling method for the auxiliary supporting structure of the circuit board according to the preferred embodiment of the invention.

Hereinafter, the elements with the same references as referred in the previously mentioned embodiment have the same functions and features, so the detailed descriptions are omitted for concise purpose.

Figure 7:
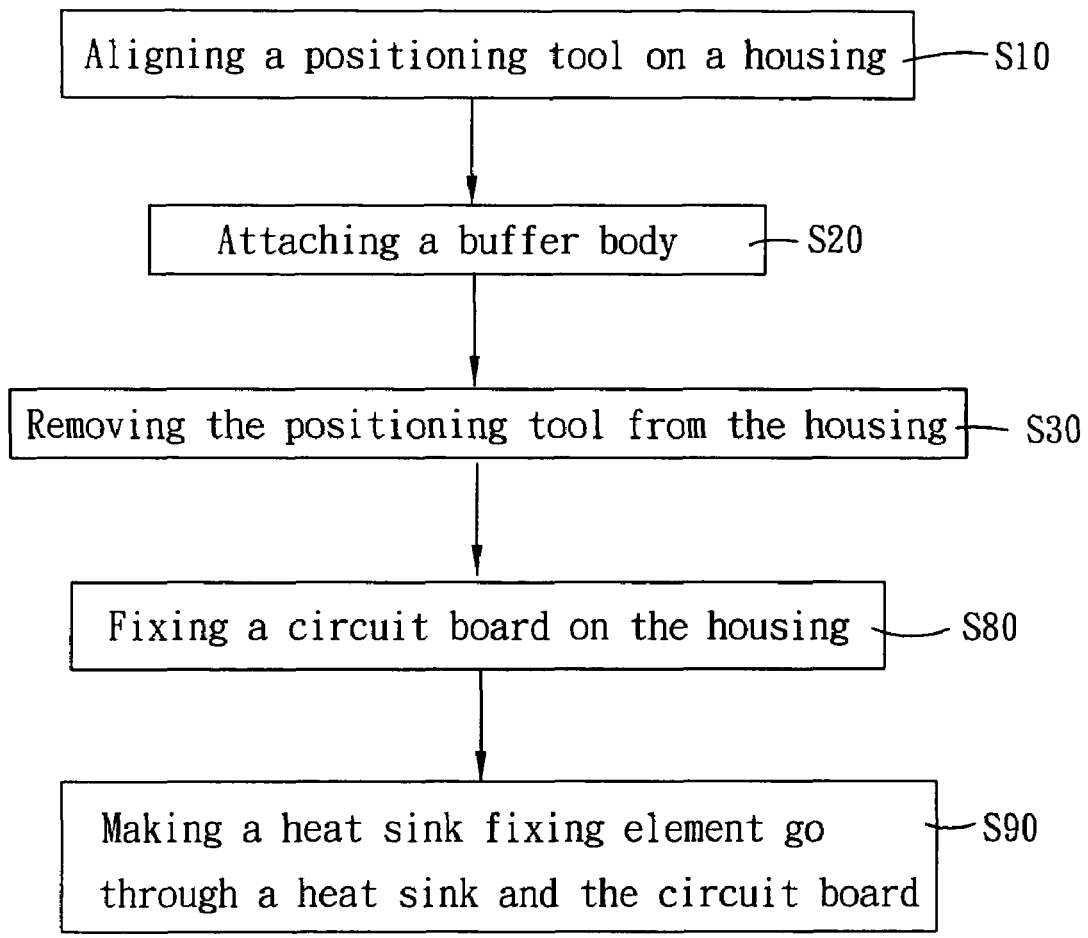
FIG. 7 is a flow chart showing an assembling method for the auxiliary supporting structure of the circuit board according to the preferred embodiment of the invention.

As shown in FIG. 7, the assembling method includes the steps of aligning a positioning tool on a housing (S10), attaching a buffer body (S20), removing the positioning tool from the housing (S30), fixing a circuit board on the housing (S80), and making a heat sink fixing element go through a heat sink and the circuit board (S90).

Figure 8:
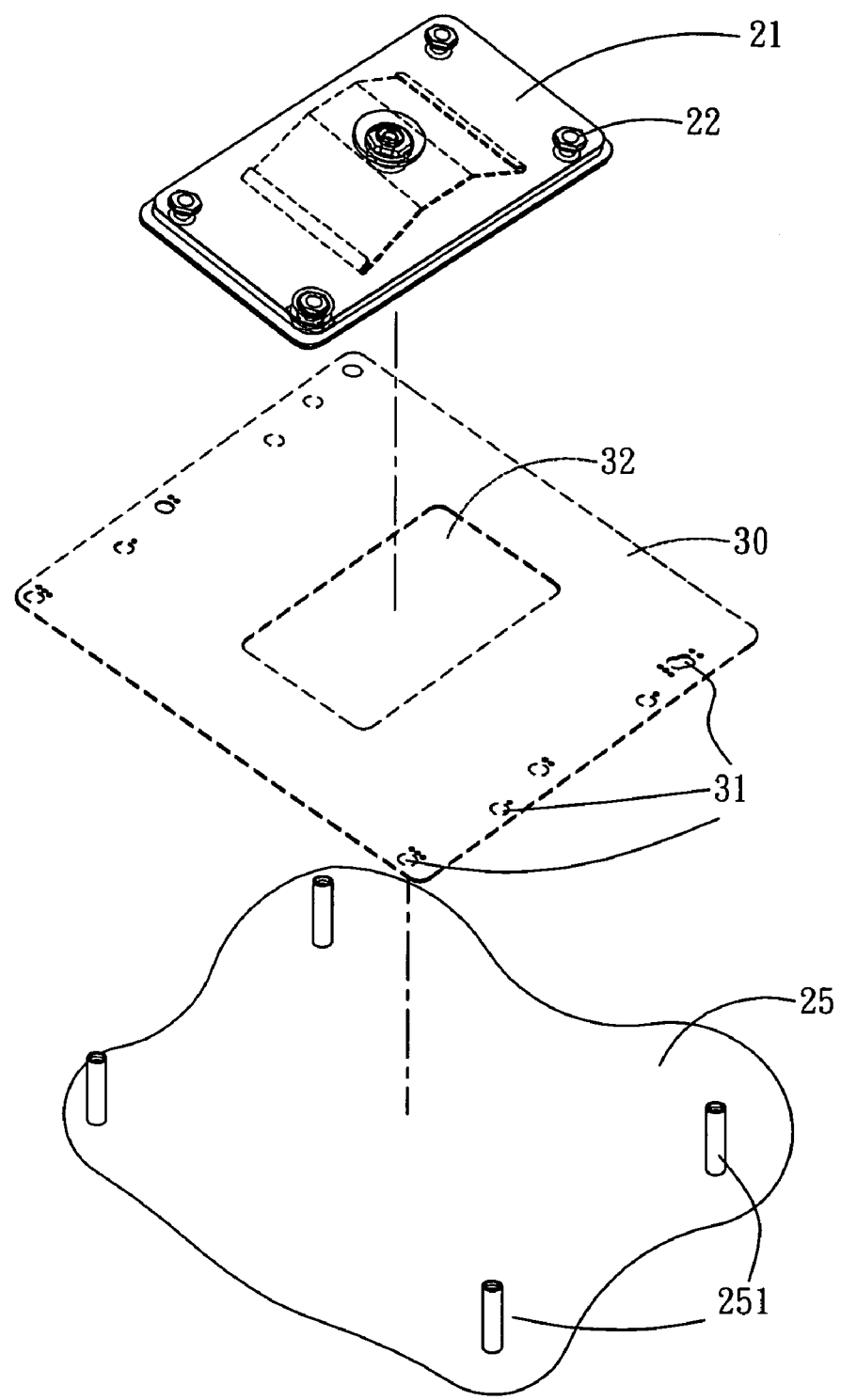
FIG. 8 is a schematic view showing the installation of a positioning tool according to the assembling method for the auxiliary supporting structure of the circuit board.

With reference to FIGS. 7 and 8, in step S10, several positioning holes 31 on the positioning tool 30 are aligned with several positioning elements 251 of the housing 25. Besides, the positioning tool 30 has an opening 32 to define the installation position of the buffer body 21. As shown in FIGS. 3 and 8, different types of circuit boards 23 occupy different positions when they are installed on the housing 25, and the positioning tool 30 thus has several sets of through holes 31 for them. This helps increasing the compatibility of the auxiliary supporting structure.

Figure 9:
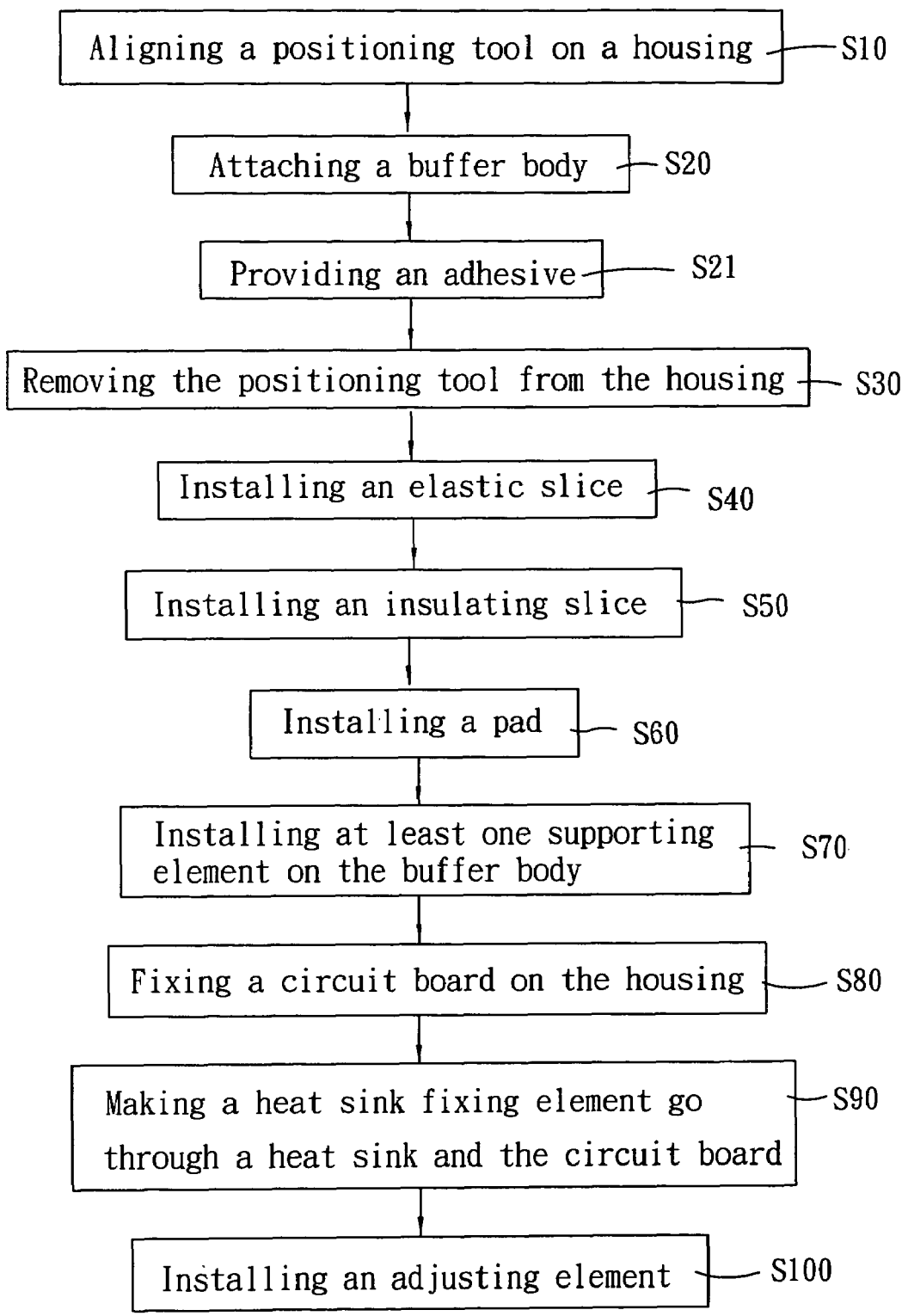
FIG. 9 is a flow chart showing another assembling method for the auxiliary supporting structure of the circuit board according to the preferred embodiment of the invention.

With reference to FIGS. 4, 7 and 9, in step S20, the buffer body 21 is attached to the housing 25. In this embodiment, the assembling method also includes the step of providing an adhesive (S21) to attach the second surface 212 of the buffer body 21 to the housing 25.

With reference to FIGS. 8 and 9, step S30 is to remove the positioning tool 30 from the housing 25.

With reference to FIGS. 4 and 9, in this embodiment, the assembling method for the auxiliary supporting structure of the circuit board further includes the step of installing an elastic slice (S40) on a first surface 211 of the buffer body 21 by, for example, a screw. The elastic slice 27 indirectly imposes a force on the circuit board 23 to ensure a tight connection between the CPU 231 and the heat sink 24.

With reference to FIGS. 4 and 9, the assembling method of the invention further includes the step of installing an insulating slice (S50) between the circuit board 23 and the buffer body 21. Therefore, the buffer body 21 and the circuit board 23 are not in direct contact to form a short circuit.

With reference to FIGS. 5 and 9, the assembling method of the invention further includes the step of installing a pad (S60) between the buffer body 21 and the circuit board 23. The pad 29 indirectly imposes a force on the circuit board 23 to ensure a tight connection between the CPU 231 and the heat sink 24. The pad 29 may further alleviate the weight of the heat sink 24.

With reference to FIGS. 4, 5 and 9, in this embodiment, the assembling method also includes the step of installing at least one supporting element on the buffer body (S70). In this case, at least one supporting element 22 is installed on the buffer body 21 and may be the combination of a nut and bolt or a screw boss.

As shown in FIGS. 3 and 7, when fixing a circuit board on the housing (S80), a circuit board 23 is locked by a screw on the housing 25. The circuit board 23 has a CPU 231 installed thereon through a CPU socket 232.

As shown in FIGS. 3 and 7, a heat sink fixing element goes through the heat sink and the circuit board (S90) so as to be fixed with the supporting element 22. The heat sink 24 is thus fixed on the CPU 231.

With reference to FIGS. 6 and 9, in this embodiment, the assembling method further includes the step of installing an adjusting element (S100) between the supporting element 22 and the heat sink fixing element 241. The adjusting element 211 may be a screw with a screw hole, having one end connected to the heat sink fixing element 241 and the other end connected to the supporting element 22.

In summary, the auxiliary supporting structure of the circuit board and the method for the same install a buffer body on a housing. Comparing to the prior art, a buffer body for a supporting element is installed on the housing in this invention to help supporting the circuit board and the weight of the heat sink in tight contact with the CPU on the circuit board. Since the buffer body is disposed on the housing that is firmer, the weight of the heat sink is distributed to the housing without deforming the circuit board or breaking the internal circuit, the through hole, or the buffer body. Therefore, the quality of the products is improved. Moreover, in an embodiment of the invention, the auxiliary supporting structure of the circuit board can further includes an adjusting element to connect the heat sink fixing element and the supporting element of different lengths, increasing the compatibility of the supporting structure of the circuit board of the invention with different types of heat sinks. In the assembling method of the invention, the positioning tool has several sets of through holes for different types of heat sinks to align with the positioning elements on the housing for a better compatibility. Furthermore, the auxiliary supporting structure of the circuit board can include a pad or an elastic slice on the buffer body to press against the circuit board. This ensures a tight attachment of the CPU on the heat sink to improve the heat dissipation efficiency.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An auxiliary supporting structure of a circuit board to support at least one part of the circuit board in a housing, the circuit board having a central processing unit (CPU) socket for connecting with a CPU and a through hole for a heat sink fixing element to pass through, the auxiliary supporting structure comprising:
   a buffer body located between the circuit board and the housing and has a first surface facing the circuit board and a second surface;
   an adhesive disposed on the second surface of the buffer body for connecting the housing and the buffer; and
   a supporting element installed on the buffer body and corresponding to the through hole, wherein the heat sink fixing element passes through the through hole to connect with the supporting element.

2. The auxiliary supporting structure of claim 1, wherein the heat sink fixing element fixes a heat sink on the CPU.

3. The auxiliary supporting structure of claim 1, wherein the supporting element comprises an adjusting element connected to the heat sink fixing element for fastening the heat sink fixing element to the supporting element.

4. The auxiliary supporting structure of claim 1, wherein the supporting element and the buffer body are integrally formed.

5. The auxiliary supporting structure of claim 1, further comprising:
   a pad, wherein one side of the pad connects to the buffer body, and the other side of the pad connects to the circuit board.

6. The auxiliary supporting structure of claim 1, further comprising:
   an elastic slice, wherein one side of the elastic slice connects to the buffer body, and the other side of the elastic slice connects to the circuit board.

7. The auxiliary supporting structure of claim 1, further comprising:
   an insulating slice, wherein one side of the insulating slice connects to the buffer body, and the other side of the insulating slice connects to the circuit board.

8. An assembling method for an auxiliary supporting structure of a circuit board, comprising:
   attaching a buffer body with an adhesive disposed on one side of the buffer body to a supporting element on the housing;
   fixing a circuit board installed with a CPU on the housing; and
   inserting a heat sink fixing element through a heat sink and the circuit board to connect with the supporting element, wherein the heat sink is disposed on the CPU.

9. The assembling method of a claim 8, further comprising:
   aligning a positioning tool on a housing, wherein the positioning tool has a plurality of through holes for aligning with a plurality of positioning elements of the housing, so that the positioning tool properly positions the buffer body on the housing.

10. The assembling method of claim 9, wherein the positioning tool has an opening to define the location of the buffer body.

11. The assembling method of claim 8, further comprising:
    installing an elastic slice on a first surface of the buffer body.

12. The assembling method of claim 8, further comprising:
    installing a pad on a first surface of the buffer body.

13. The assembling method of claim 8, further comprising:
    installing an insulating slice between the circuit board and the buffer body wherein one side of the insulating slice connects to the circuit board and the other side of the insulating slice connects to the buffer body.

14. The assembling method of claim 8, wherein the supporting element comprises an adjusting element connected to the heat sink fixing element for fastening the heat sink fixing element to the supporting element.

* * * * *